United States Patent
Yanagawa

(10) Patent No.: US 6,567,286 B2
(45) Date of Patent: May 20, 2003

(54) CONTENTS ADDRESSABLE MEMORY WITH ACCELERATED ENTRY DATA SHUNTING

(75) Inventor: Miki Yanagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/043,113

(22) Filed: Jan. 14, 2002

(65) Prior Publication Data

US 2002/0181263 A1 Dec. 5, 2002

(30) Foreign Application Priority Data

May 30, 2001 (JP) ........................... 2001-162183

(51) Int. Cl.⁷ .................... G11C 15/00; G11C 7/00
(52) U.S. Cl. ............... 365/49; 365/189.05; 365/189.07; 365/189.08
(58) Field of Search ............... 365/49, 189.05, 365/189.07, 189.08

(56) References Cited

U.S. PATENT DOCUMENTS

| | | | | |
|---|---|---|---|---|
| 5,339,268 A | * | 8/1994 | Machida ................. | 365/49 |
| 5,388,066 A | * | 2/1995 | Hamamoto et al. ....... | 365/49 |
| 5,422,828 A | * | 6/1995 | Choate et al. ........... | 342/458 |
| 5,428,565 A | * | 6/1995 | Shaw ..................... | 365/49 |
| 5,532,693 A | * | 7/1996 | Winters et al. .......... | 341/51 |
| 5,557,218 A | * | 9/1996 | Jang ...................... | 326/40 |
| 5,642,320 A | * | 6/1997 | Jang ...................... | 365/222 |
| 6,081,440 A | * | 6/2000 | Washburn et al. ........ | 365/49 |
| 6,081,441 A | * | 6/2000 | Ikeda .................... | 365/49 |
| 6,108,227 A | * | 8/2000 | Voelkel .................. | 365/49 |
| 6,181,591 B1 | * | 1/2001 | Miyatake et al. ........ | 365/49 |
| 6,201,753 B1 | * | 3/2001 | Akaogi et al. .......... | 365/226 |
| 6,252,872 B1 | * | 6/2001 | Tzeng .................... | 370/360 |
| 6,342,710 B1 | * | 1/2002 | Higuchi et al. .......... | 257/213 |
| 6,418,042 B1 | * | 7/2002 | Srinivasan et al. ....... | 365/49 |
| 6,421,264 B1 | * | 7/2002 | Hayakawa et al. ....... | 365/49 |

* cited by examiner

*Primary Examiner*—David Nelms
*Assistant Examiner*—Ly Duy Pham
(74) *Attorney, Agent, or Firm*—Arent Fox Kintner Plotkin & Kahn, PLLC

(57) ABSTRACT

A contents addressable memory comprises: memory cells arranged in a matrix at positions where word lines extending along a row cross bit lines extending along a column; and search buses extending along the column and match lines extending along the row; and a comparison circuit, provided in each memory cell, comparing data in search bus and data stored in memory cell and outputting comparison result to the match line. Transfer units having a first transfer gate, a transfer cell for temporarily storing data from memory cell, and a second transfer gate are provided between a pair of memory cells arranged along the column. Data from one of pair of memory cells is stored in the transfer cell via first or second transfer gate, then that data stored in transfer cell is stored in other of pair of memory cells via the second or first transfer gate.

8 Claims, 11 Drawing Sheets

CONTENTS ADDRESSABLE MEMORY WITH ACCELERATED ENTRY DATA SHUNTING

BACKGROUND OF THE INVENTION

1. Field of the Invention

The present invention relates to a contents addressable memory (CAM), and more particularly to a contents addressable memory with accelerated exchanging within a cell array of entry data that has been stored in memory cells.

2. Description of the Related Art

A contents addressable memory (hereinafter simply referred to as CAM) is also called associative memory and outputs addresses in which input data is stored for that input data. FIG. 1 explains the differences between an ordinary memory and CAM. In an ordinary memory, data stored in an address within the memory is output when that address is input. In contrast, with CAM, the address in which data is stored is output when data is entered.

With the popularization of the Internet in recent years, demand for such CAM is increasing. That is, when ordinary CAM is used to enable a network server to refer to an IP address embedded in the transfer data packet and to detect the transfer destination data, the IP address is input into CAM as data, the corresponding address is read, and the transfer destination data is detected based on the address thus read.

CAM includes a memory cell array in the same way as an ordinary memory. In addition, just as with an ordinary memory, by inputing an address, a desired data can be written to or read from the memory cell array. Furthermore, CAM has a comparison means for comparing entered data, known as entry keys, and stored data, known as entry data that is stored in a memory cell array. Any memory cell address in which both match is output as a matching address.

One specific function of CAM is an exchanging of entry data within a memory cell array. When priority must be given to entry data strings, the entry data strings are stored within the memory cell array in accordance with their priority. That order of priority is reviewed at prescribed intervals. Accordingly, after the order of priority is reviewed, the entry data must be re-arranged within the memory cell array using the new order of priority. Alternatively, the new entry data must be written in a prescribed address position within the entry data string in the memory cell array. Here too, entry data stored in or below the newly written address must be transferred to a lower or higher address.

Transfer of entry data is required to enable the re-arrangement or writing of entry data as described above. Such transfer is realized by multiple repetitions of operations in which simply stored entry data is read and written to a new address position. The repetition of these read and write operations of CAM is not desirable since it dramatically reduces the performance of the system in which CAM is mounted.

SUMMARY OF THE INVENTION

Thus, an object of the present invention is to provide a CAM that can transfer stored data within a cell array at high speed.

Another object of the present invention is to provide a CAM that can transfer stored data within a cell array without reading to or writing from external equipment the data.

To achieve the above objects, one aspect of the present invention is a contents addressable memory, comprising: memory cells arranged in a matrix at positions where word lines extending along a row cross bit lines extending along a column; search buses extending along the column and match lines extending along the row; and a comparison circuit provided in each memory cell and which compares data in the search bus and data stored in memory cell and outputs comparison result to the match line; wherein transfer units having a first transfer gate, a transfer cell for temporarily storing data from said memory cell, and a second transfer gate are provided between a pair of memory cells arranged along the column; and data from one of pair of memory cells is stored in the transfer cell via the first or second transfer gate, then that data thus stored in the transfer cell is stored in other of pair of memory cells via the second or first transfer gate.

In the above invention, transfer units are provided between a pair of memory cells arranged along the column. For example, the first transfer gate is opened and data in one of the pair of memory cells is transferred to the transfer cell and temporarily stored there. The first transfer gate is then closed, the second transfer gate is opened, and the data temporarily stored in the transfer cell is transferred to the other memory cell in the pair. This transfer operation ensures that the stored data can be transfered within a cell array without requiring it to be read to or written from external equipment.

In a more preferable embodiment of the present invention, by arranging the above transfer unit between memory cells that are adjacent along the column, data from a plurality of memory cells can be transferred to each corresponding adjacent memory cells in the same column. Accordingly, there is no need for repeated operations involving the reading of data in memory cells in one row and writing of it to memory cells in another row.

In a more preferable embodiment of the present invention, the above transfer cell has a capacitor in which data is stored, and the memory cell has a latch circuit that cross-connects a pair of inverters. Furthermore, when data is transferred from the transfer cell, the memory cell latch circuit is temporarily made neutral and then the transfer data is latched. In this embodiment, since the transfer cell comprises capacitors of a passive element and has no drive capability, so when data is to be transferred to a memory cell configured with a latch circuit, a short-circuit is produced between the nodes of this latch circuit, so that the circuit is placed in a neutral status, and then transfer data is latched. This means that the transfer data in the capacitor can be latched by the memory cell latch circuit even if there is no drive element in the transfer cell.

In another preferable embodiment of the present invention, the above transfer cell has a latch circuit that cross-connects a pair of inverters. Furthermore, when data is to be transferred from the above transfer cell, the latch operation of the memory cell latch circuit is temporarily released and the memory cell is driven from the latch circuit in the transfer cell. Thereafter, the transfer data is latched by the memory cell. When the second transfer gate is opened and data is transferred from the transfer cell, temporary release of the latch operation in the memory cell latch circuit enables accurate transfer of data even when the drive capability of the latch circuit in the transfer cell is low.

To achieve the above objects, another aspect of the present invention is a contents addressable memory that compares stored data and input data, and outputs address information in which matching data is stored, comprising: memory cells arranged in a matrix at positions where word lines extending along a row cross bit lines extending along a column; search buss extending along the column and match lines extending along the row; a comparison circuit provided in each memory cell and which compares data in the search bus and data stored in memory cell and outputs comparison result to the match line; and transfer units each provided between a pair of memory cells arranged along the column and each comprising a first transfer gate, a transfer cell for temporarily storing data from the memory cell, and a second transfer gate; wherein data from one of pair of memory cells is stored in the transfer cell via the first or second transfer gate, then the data thus stored in the transfer cell is stored in other of pair of memory cells via the second or first transfer gate.

DESCRIPTION OF THE PREFERRED EMBODIMENTS

Embodiments of the present invention will be explained below with reference to the figures. However, the scope of the present invention is not limited by the following embodiments and extends to include the invention as described in the claims and any other equivalents.

Figure 1:
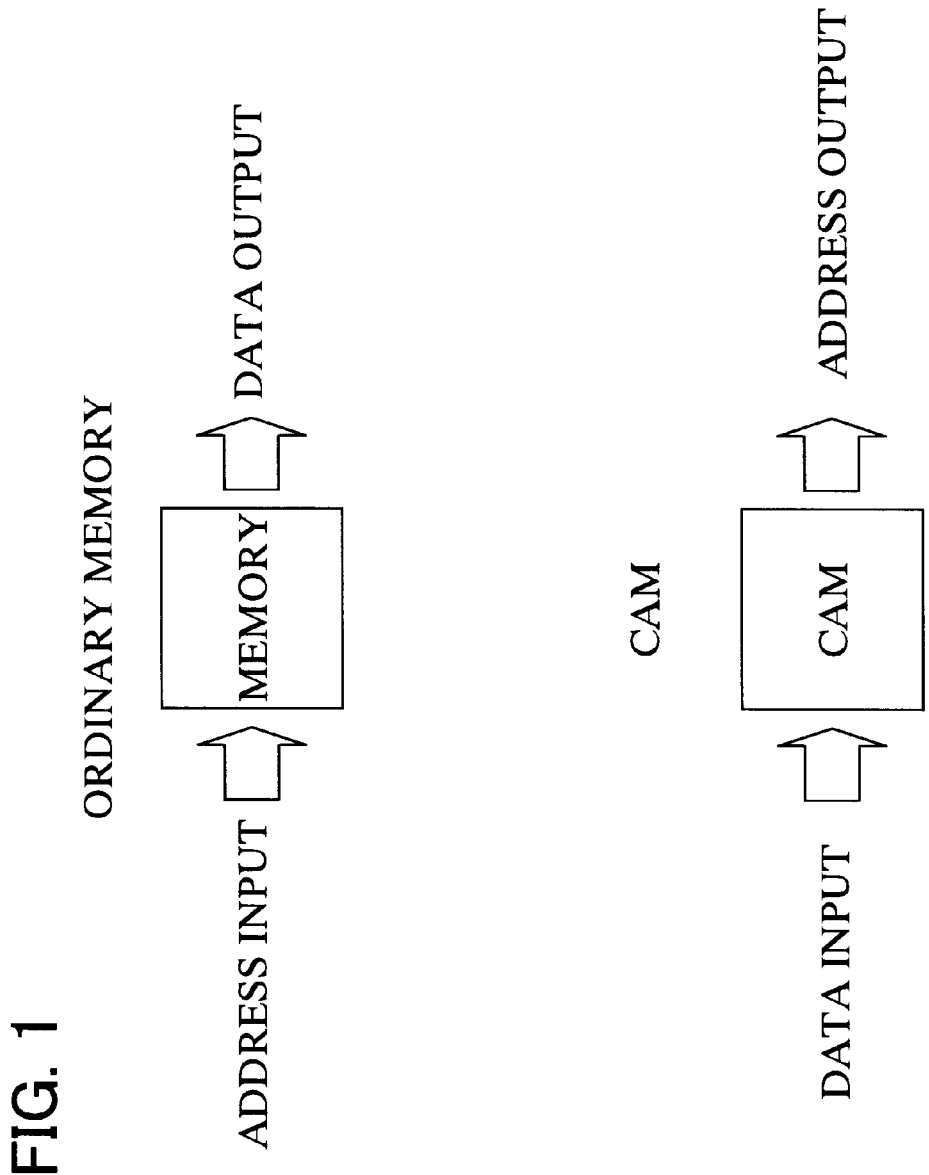
FIG. 1 is a diagram explaining the difference between an ordinary memory and CAM.
Figure 2:
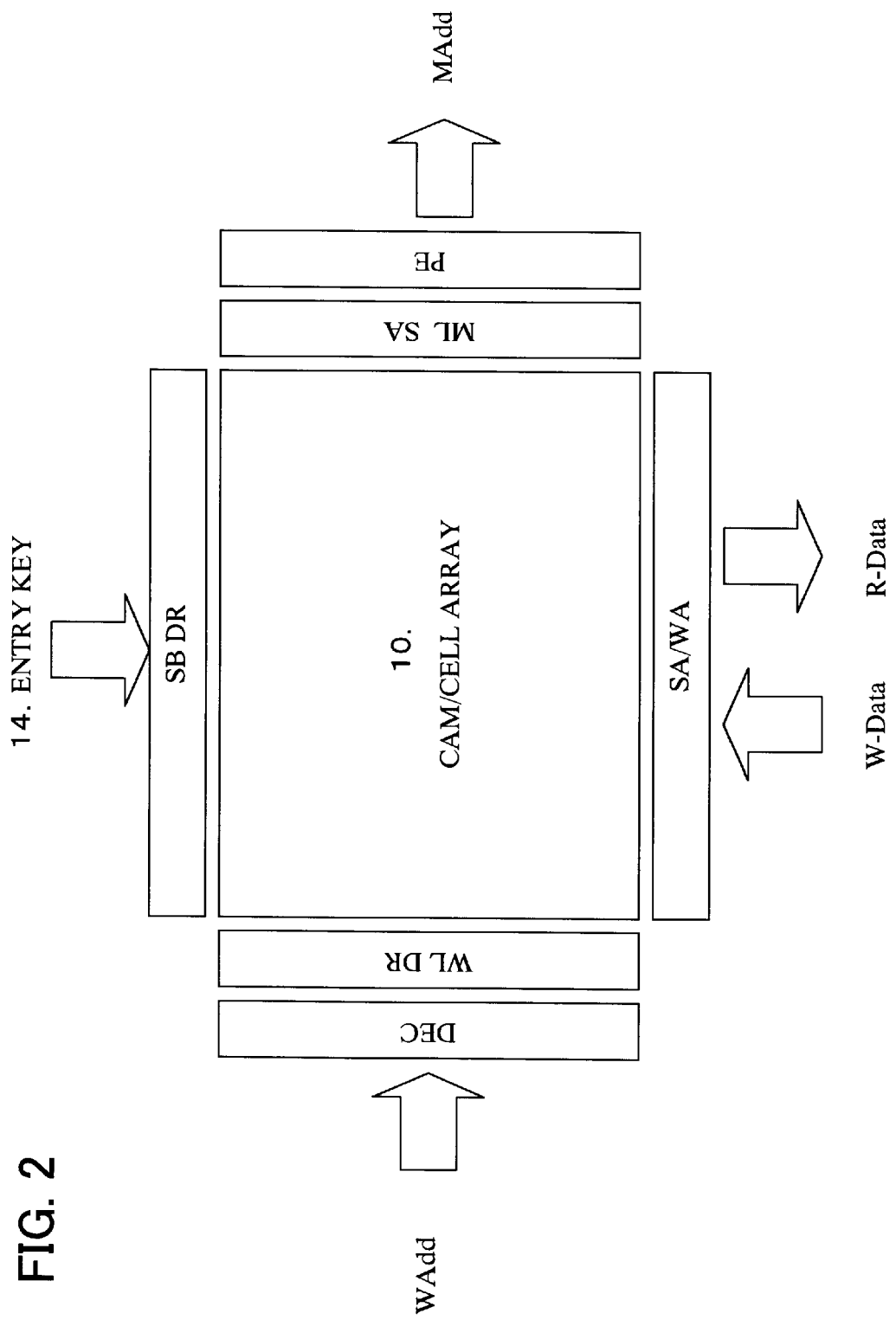
FIG. 2 is a diagram showing the configuration of CAM.

FIG. 2 shows the configuration of CAM. CAM first stores entry data in a CAM cell array 10, detects entry data that matches the entry key 14 input thereafter, and then outputs the address for that matched entry data. Therefore, CAM comprises: a decoder DEC that decodes, for the CAM cell array 10, addresses WAdd to which data is written from the outside; a word line driver WLDR that drives a word line in accordance therewith; and a sense amplifier and write amplifier SA/WA. Up to this point, the CAM configuration is the same as that for ordinary memory.

Furthermore, CAM comprises a scan bus driver SBDR that drives scan buses provided in the cell array 10 according to the entry key 14 that is entered from the outside when data is being retrieved, a match line sense amplifier MLSA that amplifies the match lines in which the results of a comparison between the scan bus entry key and entry data stored in the cell array 10 are output, and a priority encoder PE that generates a match address MAdd to correspond to the match line that shows a match.

Figure 3:
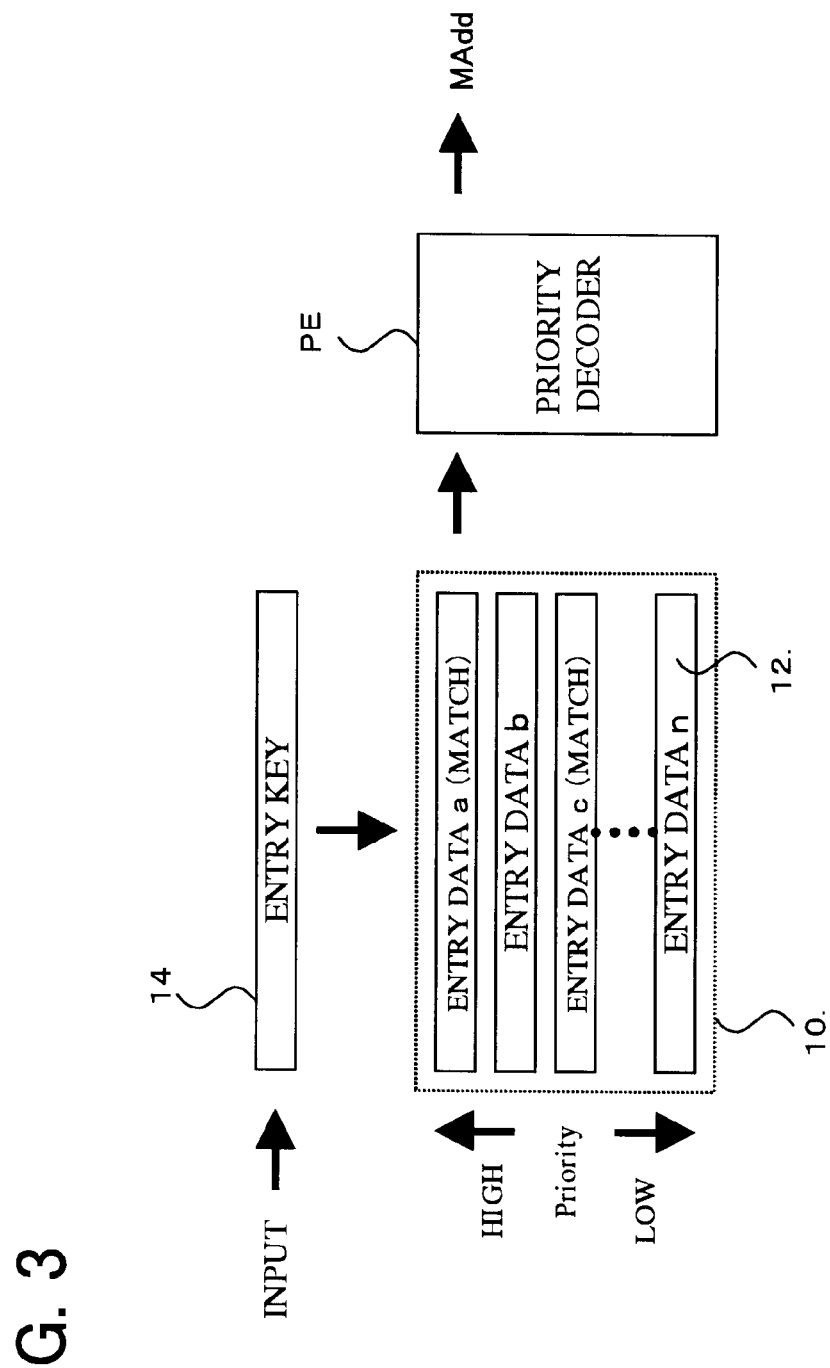
FIG. 3 is a diagram explaining the operation of CAM.

FIG. 3 explains the operation of CAM. In the CAM cell array 10, entry data a through n is stored in memory cells along a row to form an entry data column 12. This entry data is lined up in order of highest priority in relationship to row addresses. The entry key 14 input from the outside is compared with the data in the entry data column 12. Match or no match data is output in the priority encoder PE. In the example in FIG. 3, entry data a and c match the input entry key c but no other data matches. Here, the priority encoder PE outputs the lowest matching address as the match address MAdd.

Figure 4:
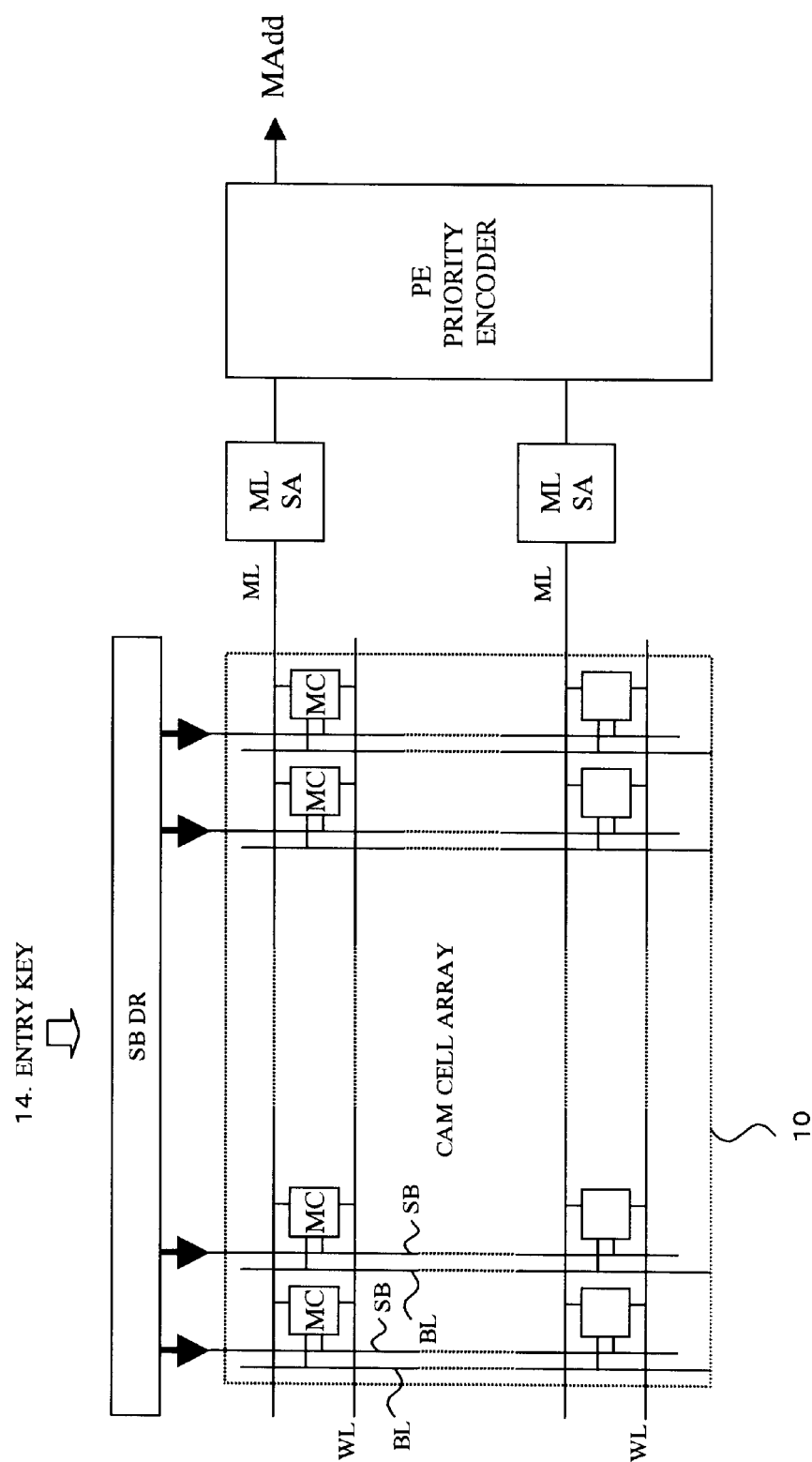
FIG. 4 is a detailed schematic view of CAM.

FIG. 4 is a detailed schematic view of CAM. In the cell array 10, memory cells MC are arranged in a matrix at a position where word lines WL extending along a row cross bit lines BL extending along a column. Furthermore, there are search buses SB that run parallel to the bit lines BL and match lines ML that run along rows. There is a built-in comparison circuit, which will be discussed later, in the memory cell MC. This circuit is used to compare the entry key in the search bus SB that is driven by a search bus driver SBDR and the entry data stored in the memory cell MC. The results of the comparison are output in the match line ML. For example, an H level is output in the match line ML when the data matches and an L level is output when it does not. The voltage of each of these match lines ML is amplified in the match line sense amp MLSA and supplied to the priority encoder PE.

Accordingly, previously stored entry data is written to a memory cell from a bit line by driving the word line. The entry key is supplied to a comparison circuit within the memory cell via the search bus SB.

Figures 5A, 5B:
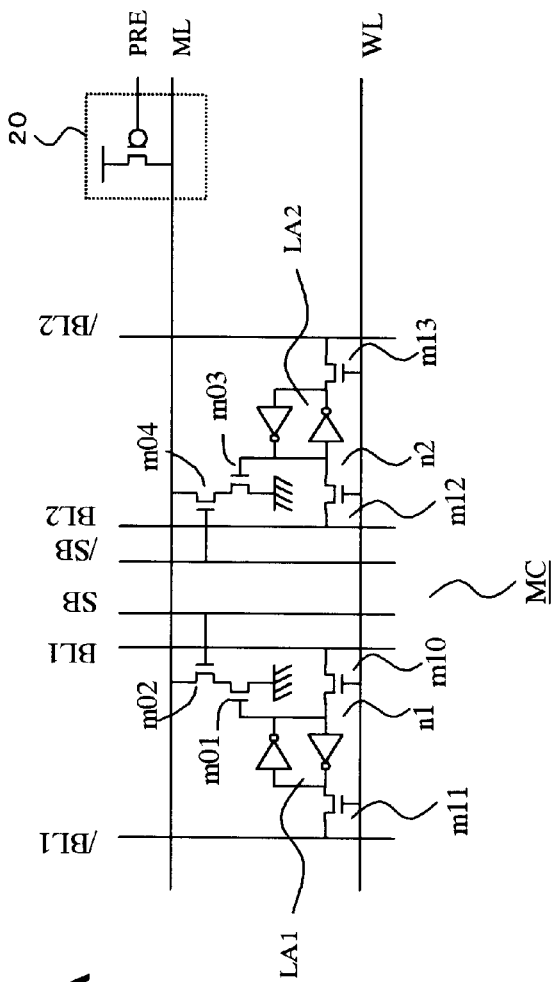
FIGS. 5a and 5b are diagrams showing a specific example of a circuit in a CAM memory cell.

FIG. 5 shows a specific example of a circuit in a CAM memory cell. FIG. 5A is a circuit diagram and FIG. 5B is a table showing the H/L level of the bit lines BL and the search buses SB that correspond to entry data and entry keys. Entry data and entry keys are ternary data comprising "mask status" and the two values "0" and "1". When a mask status is valid, that data is ignored in the comparison operation. When the mask status is released, the binary data is compared. Therefore, the memory cell MC of this example contains two latch circuits LA1 and LA2 which are used to store the ternary data. These latch circuits LA1 and LA2 have, for example, a circuit configuration that is the same as the SRAM cell that cross connects two inverters. Each node is connected to two bit line pairs BL1,/BL1 and BL2,/BL2 via transfer gate transistors m10, m11, m12, and m13.

Also, memory cell MC has comparison circuits that compare search buses SB,/SB and nodes n1 and n2 in the latch circuits LA1 and LA2. The first comparison circuit is a series circuit including transistors m01 and m02. The second comparison circuit is a series circuit including transistors m03 and m04. When both the node n1 and search bus SB are the H level, transistors m01 and m02 in the first comparison circuit both become conductive and the match line ML moves to the L level. When either one of these is the L level, one transistor is not conductive and the match line ML moves to the H level. Transistors m03 and m04 in the second comparison circuit operate in the same way.

As shown in the table in FIG. 5B, when data "0" is written, "LHHL" is applied to the two bit line pairs BL1,/BL1 and BL2,/BL2 and nodes n1 and n2 become "LH". When data "0" is entered during a search, voltages "HL" that are opposit to nodes n1 and n2 are applied to the search buses SB,/SB. Accordingly, when data "0" in the memory cell MC matches data "0" in the search bus, the match line ML moves to the H level. When they do not match, the match line ML moves to the L level. The match line ML includes a precharge circuit 20. A precharge signal PRE is on the H level prior to comparison and the match line ML is precharged to the H level.

On the other hand, when data "1" is written, "HLLH" is applied to the two bit line pairs BL1,/BL1 and BL2,/BL2 and nodes n1 and n2 become "HL". When data "1" is entered during a search, voltages "LH" that are opposit to nodes n1 and n2, are applied to search buses SB,/SB. Accordingly, when data "1" in the memory cell MC matches data "1" in the search bus, the match line ML moves to the H level. When they do not match, the match line ML moves to the L level.

Furthermore, when a mask status is written, "LHLH" is applied to bit line pairs BL1,/BL1 and BL2,/BL2 and nodes n1 and n2 become "LL". In contrast, "LL" is applied to search buses SB,/SB. Accordingly, during a search, when the entry data in the memory cell is a mask status or when the entry key applied to the search bus is a mask status, the match line ML moves to the H level. When neither entry is a mask status, the match line ML moves to the H level or L level depending on whether or not data "0" and "1" match.

Memory cell MC comparison circuits m10, m11, m12, and m13 make up a wired OR circuit along the match line ML that extends along a row. Therefore, when all memory cells along a row match, the match line ML maintains the H level.

The memory cell can also be configured in the same way as a DRAM cell configured with one transfer gate and one capacity. In such configuration, a pair of bit lines are connected to a pair of cells.

Figure 6:
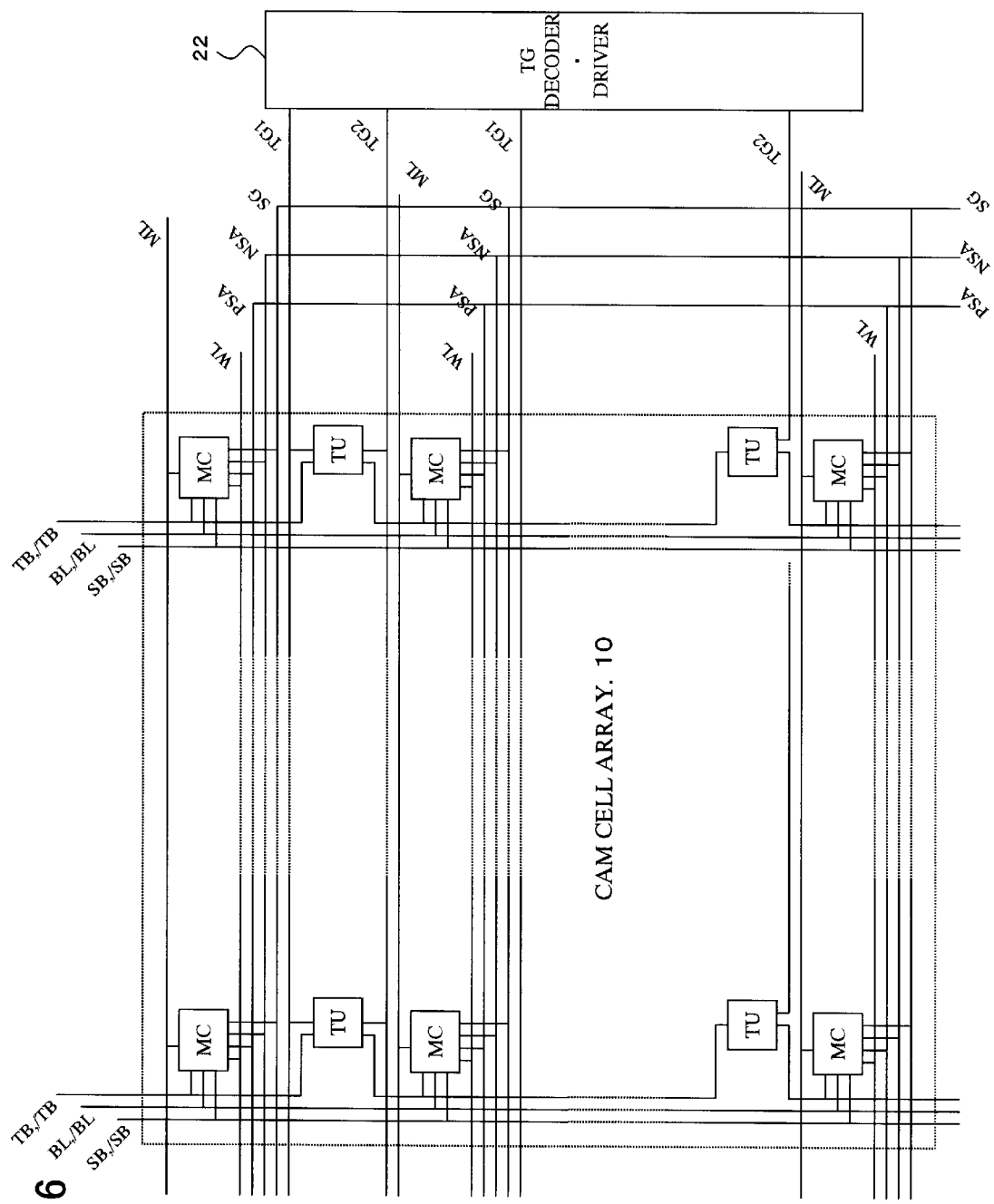
FIG. 6 is a diagram showing a schematic view of CAM in the present embodiment.

FIG. 6 shows an overall schematic view of CAM in the present embodiment. In the CAM of this embodiment, a transfer unit TU is installed between adjacent memory cells MC in a column. This transfer unit TU gathers all data stored in one memory cell MC and transfers it to the other memory cell MC. Transfer gates, which are not shown, are provided in the transfer unit TU and controlled by transfer gate signals TG1 and TG2. Transfer gate signals TG1 and TG2 are driven by the transfer gate decoder driver 22. Also latch activation signals PSA and NSA for a built-in latch circuit in the memory cell are supplied to the memory cell MC and the latch operation of the latch circuit is temporarily released when data is transferred. In addition, the short signal SG for short-circuiting the latch circuit nodes and resetting it to an intermediate potential is supplied to the memory cell MC, so that the latch circuit is placed in a neutral state. In FIG. 6, only one of the two bit line pairs of FIG. 5 is shown.

For example, when data stored in all of the memory cells MC in a memory cell array 10 is to be respectively transferred along columns (downwards in the column), firstly the first transfer gate signal TG1 is driven by the TG decoder driver and data in all memory cells MC is transferred and stored in a transfer cell within the transfer unit TU. The second transfer gate signal TG2 is then driven and data stored in the transfer cell is then transferred to adjacent memory cells MC in the column. This enables all entry data to be transferred to an address that is one lower in the order of priority (a higher address). On the other hand, by driving the second transfer gate signal TG2 first, then driving the first transfer gate signal TG1, all entry data can be transferred to an address that is one higher in the order of priority (a lower address).

Furthermore, by selectively driving transfer gate signals TG1 and TG2 using the TG decoder driver 22, any address can be set as a boundary and data inside memory cells at addresses above or below the boundary address can be transferred in a single operation.

Figure 7:
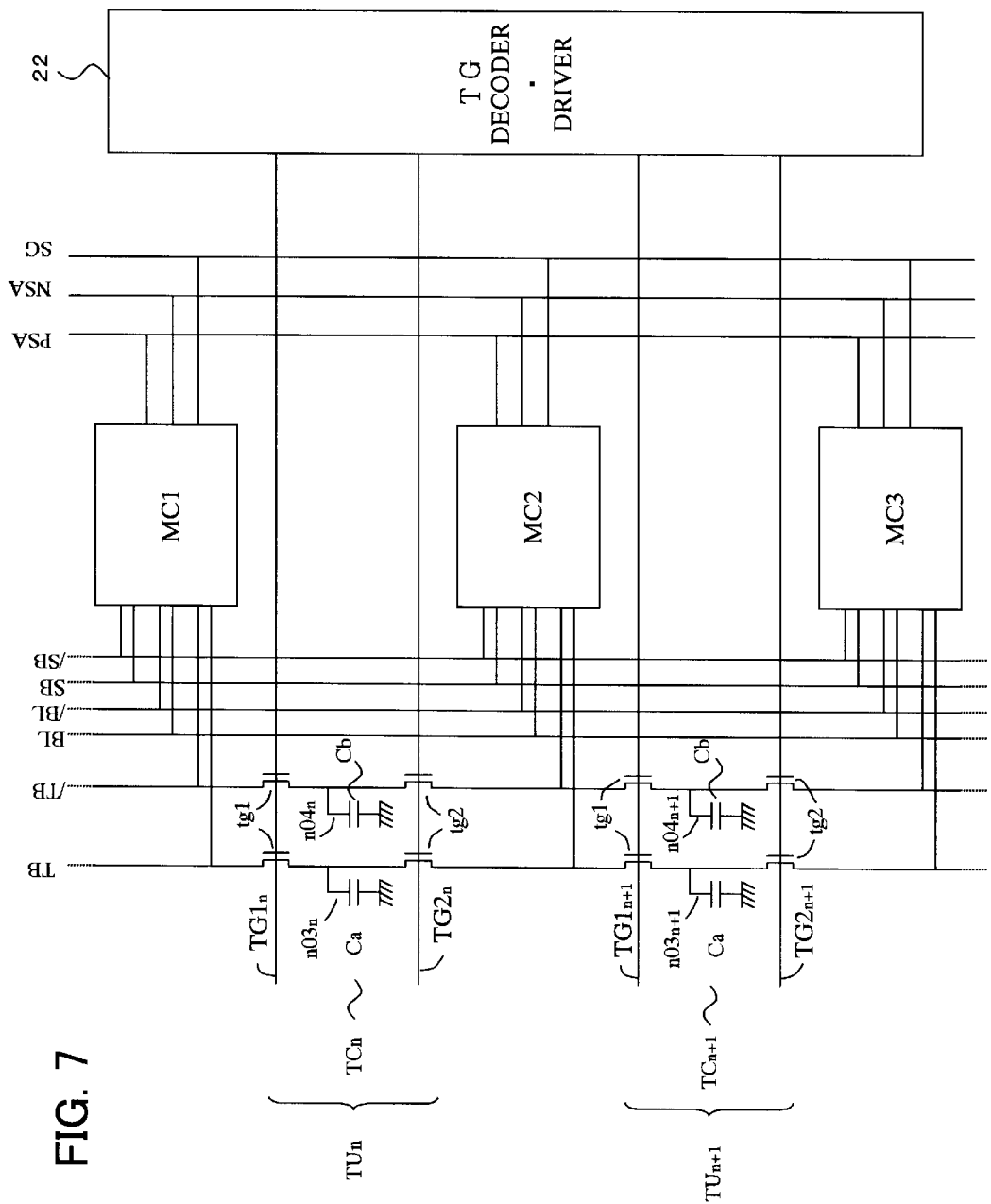
FIG. 7 is a CAM circuit diagram in the first embodiment.
Figure 8:
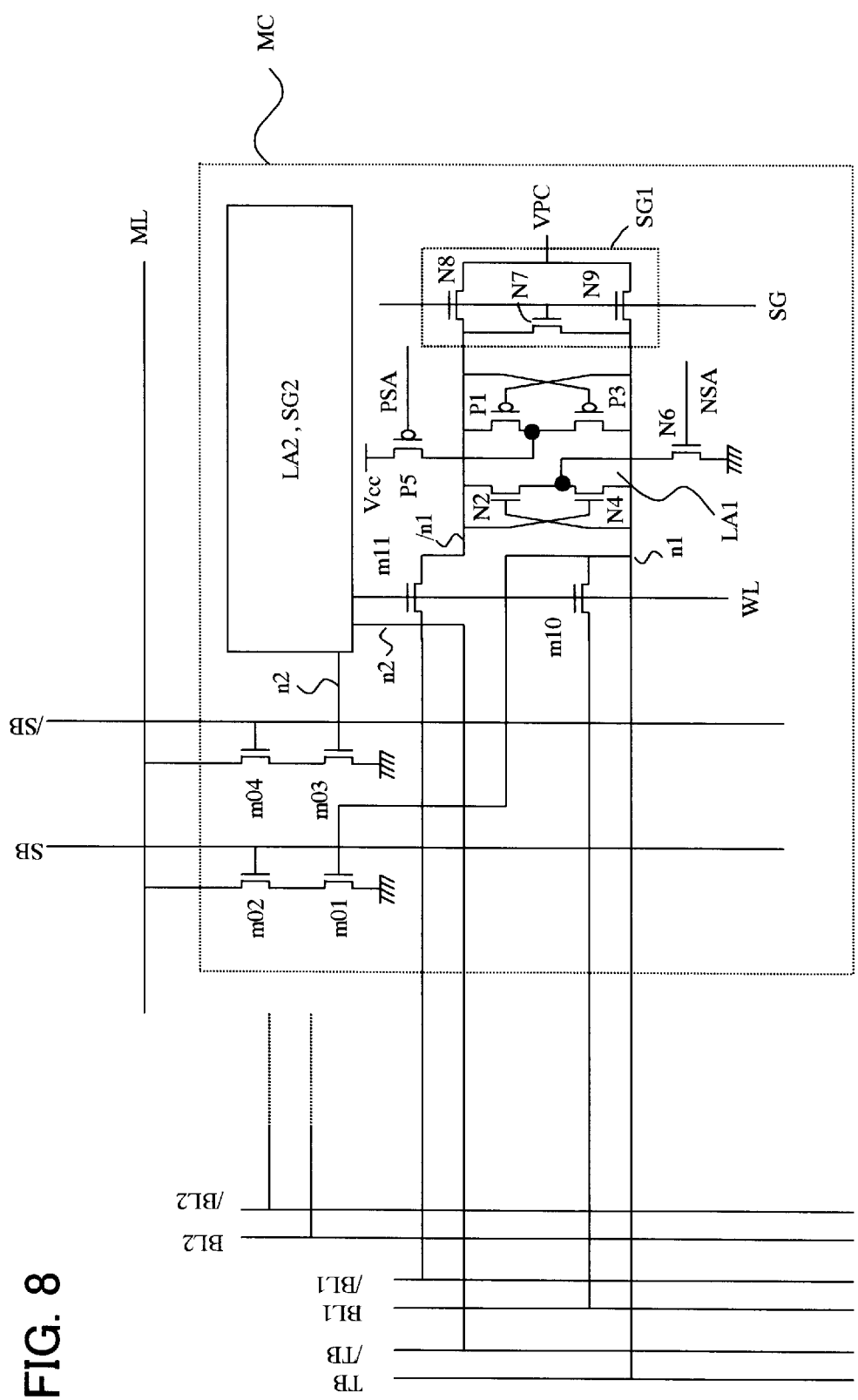
FIG. 8 is a CAM circuit diagram in the first embodiment.

FIGS. 7 and 8 are CAM circuit diagrams in the first embodiment. FIG. 7 is a specific circuit diagram for a transfer unit and FIG. 8 is a specific circuit diagram for the corresponding memory cell MC.

In the first embodiment, as shown in FIG. 7, transfer units TUn and TUn+1, which are installed between adjacent memory cells MC in a column, have transfer cells TCn and TCn+1, which comprise a pair of capacitors Ca and Cb, and first and second transfer gates tg1 and tg2. Also, transfer buses TB,/TB, which connect the transfer unit TU and memory cell MC, lie parallel to the bit line pair BL,/BL. Transfer gates tg1 and tg2 comprise N channel transistors which are each controlled by transfer gate signals TG1n, TG2n and TG1n+1 and TG2n+1. When data is transferred, a charge according to either the H level or L level of the memory cell is stored in the pair of capacitors Ca and Cb within the transfer cells. The transferred data is temporarily collected there.

Furthermore, in the first embodiment, as shown in FIG. 8, the latch circuit LA1 in the memory cell MC comprises a first inverter, which consists of a P channel transistor P1 and an N channel transistor N2, and a second inverter, consisting of transistors P3 and N4. These inverters are connected to an activation circuit comprising a P channel transistor P5 connected to a high power source Vcc and an N channel transistor N6 connected to the ground. When the activated signals PSA and NAS move to the L and H levels respectively, transistors P5 and N6, which make up an activation circuit, become conductive and activate the latch circuit LA1. When the activated signals PSA and NSA are on the H and L levels respectively, transistors P5 and N6 are not conductive and the latch circuit LA1 is deactivated.

Memory cell MC has a short circuit SG1 for creating a short circuit between the two nodes n1,/n1 in the latch circuit LA1 and for creating a neutral potential VPC. The short circuit SG1 has a transistor N7 that creates a short circuit between nodes n1,/n1, and transistors N8 and N9 that connect nodes n1,/n1 to the neutral potential VPC. These transistors are controlled by short circuit signal SG.

FIG. 8 shows one latch circuit LA1 in the memory cell MC and a short circuit SG1. However, in the memory cell MC there is also another identically configured latch circuit LA2 and a corresponding short circuit SG2. Nodes n1 and n2 from these latch circuits LA1 and LA2 are connected to transfer buses TB,/TB. Also, as shown in FIG. 5, the pair of nodes n1,/n1 in the latch circuit LA1 is connected to the pair of bit lines BL1,/BL1 via transfer transistors m10 and m11. Although not shown, the pair of nodes in the latch circuit LA2 is also connected to a second pair of bit lines BL2,/BL2.

Figure 9:
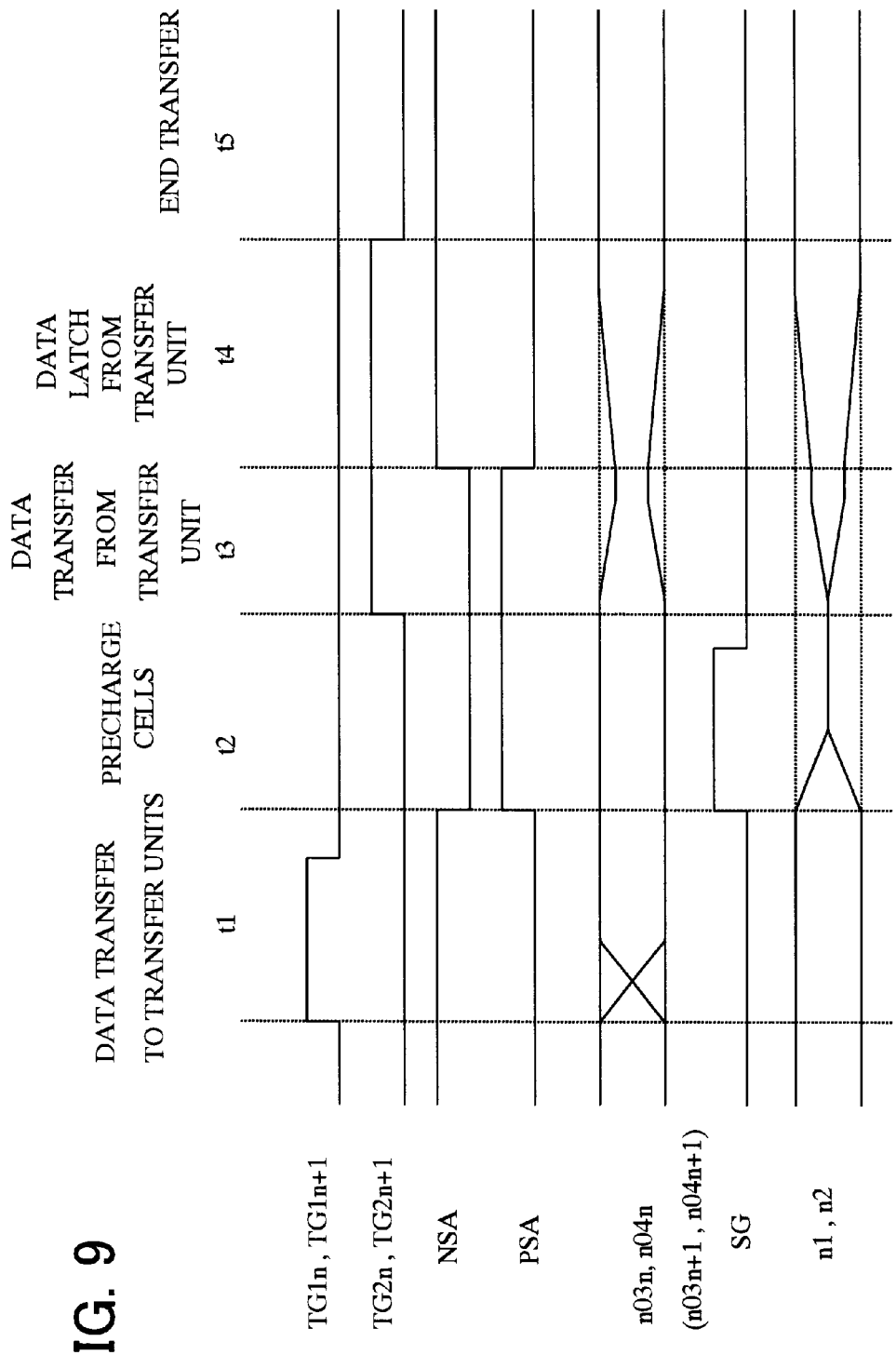
FIG. 9 is a timing chart for a data transfer operation between memory cells.

FIG. 9 is a timing chart for data transfer operations between memory cells. The operation that occurs when data from memory cells MC1 and MC2 is simultaneously transferred to memory cells MC2 and MC3, which are adjacent each other in a column, will be explained in accordance with FIG. 9. Firstly, during period t1, the TG decoder driver 22 drives transfer gate signals TG1n and TG1n+1, the first transfer gate tg1 in transfer units TUn and TUn+1 becomes conductive, and units of data in memory cells MC1 and MC2 are transferred to capacitors Ca and Cb respectively. In this transfer operation, latch circuit inverters within the memory cells drive the capacitors Ca and CB in the transistor units and drive nodes n03n, n04n, n03n+1, and n04+1 to the H and L levels respectively in accordance with stored data. At this time, the latch circuit in the memory cells is active and activated signals PSA and NSA are on L and H levels respectively. The short circuit control signal SG is on the L level. When driving of the capacitors ends, transfer gate signals TG1*n* and TG1*n*+1 move to the L level and the first transfer gate tg1 is no longer conductive.

Next, during period t2, activated signals PSA and NSA are placed on H and L levels respectively to make the latch circuits in the memory cells MC non-active. Furthermore, the short control signal SG is placed on the H level to short-circuit node pairs n1,/n1 and n2,/n2 in the latch circuits. As a result, those nodes are pre-charged to the neutral potential VPC and the latch circuits LA1, LA2 moves to a neutral status. After pre-charging, the short control signal SG is returned to the L level.

During period t3, the TG decoder driver 22 drives transfer gate signals TG2*n* and TG2*n*+1 and makes the second transfer gate tg2 within transfer units TU*n* and TU*n*+1 conductive. The voltages in nodes n03*n*, n04*n*, n03*n*+1, and n04*n*+1 within the transfer units are transferred to nodes n1 and n2 in memory cells MC2 and MC3. At this time, the potentials of nodes n1 and n2 in the memory cells rise or fall in accordance with the capacity ratio between capacitors Ca and Cb in the transfer cells and the paracitic capacitors of nodes n1 and n2 in the memory cells after transfer. As a result, node n1 rises or falls in the latch circuit LA1 within the memory cell and a minute voltage is generated between the node /n1 with neutral potential and the node n1.

During period t4, activated control signals PSA and NSA are placed on activated levels L and H respectively, thus enabling activation of latch circuits LA1 and LA2 respectively in the memory cells. Here, the minute voltage generated between nodes in the latch circuits are sensed and amplified. As a result, one of the pair of nodes n1,/n1 in the latch circuit LA1 is driven to power source Vcc level (H level) and the other to ground level (L level). As a result, data transfer ends.

As explained above, in the first embodiment, the transfer cell, which is the means for holding data within a transfer unit, comprises a pair of capacitors Ca and Cb. Such capacitors cannot actively drive subsequent memory cells MC during transfer. Accordingly, a short circuit SG1 and deactivation circuits P5 and N6 in latch circuits LA1 and LA2 are provided in the memory cell. When data is transferred, latch circuits LA1 and LA2 are both deactivated and the pair of nodes n1,/n1 is reset to the neutral potential VPC (neutral status). After transfer cell capacitors Ca and Cb are connected to the latch circuits with this neutral status, of subsequent memory cells, the cell latch circuits are activated. This operation to activate latch circuits is the same as the operation to amplify DRAM sense amp circuits. The minute voltage generated between the pair of nodes n1,/n1 is sensed and amplified.

In this first embodiment, transfer cells within the transfer unit comprise capacitors Ca and Cb and thus smaller circuits can be made. However, there is also a need to provide short circuits CG1 in memory cells to generate a neutral potential VPC. Thus a larger circuit is required in total.

In FIG. 7, a situation is explained in which the data in memory cell MC1 is held as is, and the data in memory cell MC2 is transferred to adjacent memory cell MC3. Here, the operations up to and including periods t1 and t2 in FIG. 9 are the same. Data in each memory cell is held within the transfer cell in the transfer unit and latch circuits in each memory cell are reset. Then, during period t3, transfer gate signal TG1*n* is driven again, transfer gate signal TG2*n*+1 is driven so that the data in transfer cell TC*n* is returned to memory cell MC1, and the data inside transfer cell TC*n*+1 is transferred to memory cell MC3. That is, control of transfer gate signals TG1*n*, TG2*n*, TG1*n*+1, and TG2*n*+1 by the TG decoder driver 22 as above according to the boundary for the address to which data can be transferred, enables transfer of data in memory cells at lower address than any address to the adjacent memory cells.

Figure 10:
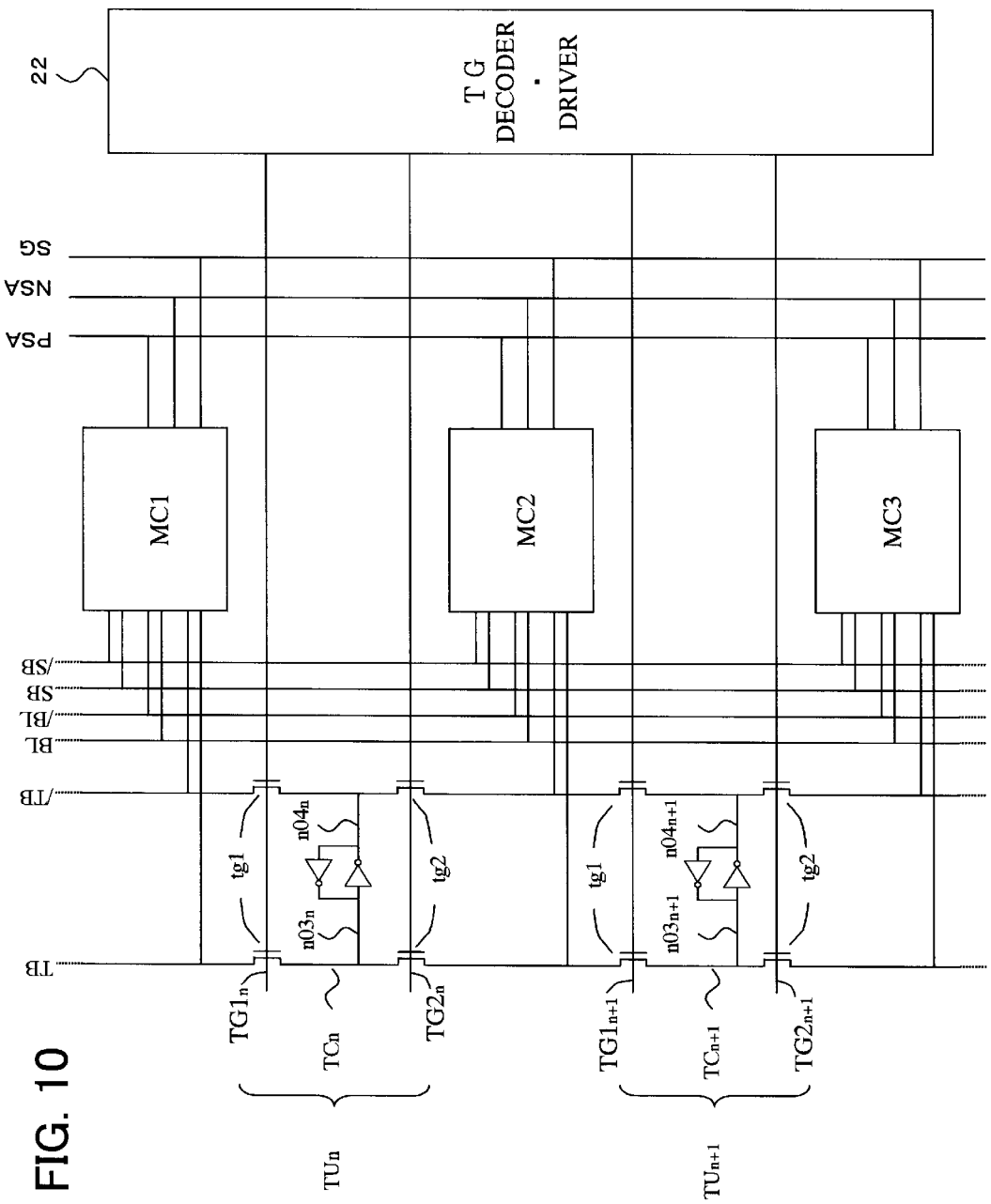
FIG. 10 is a CAM circuit diagram in the second embodiment.
Figure 11:
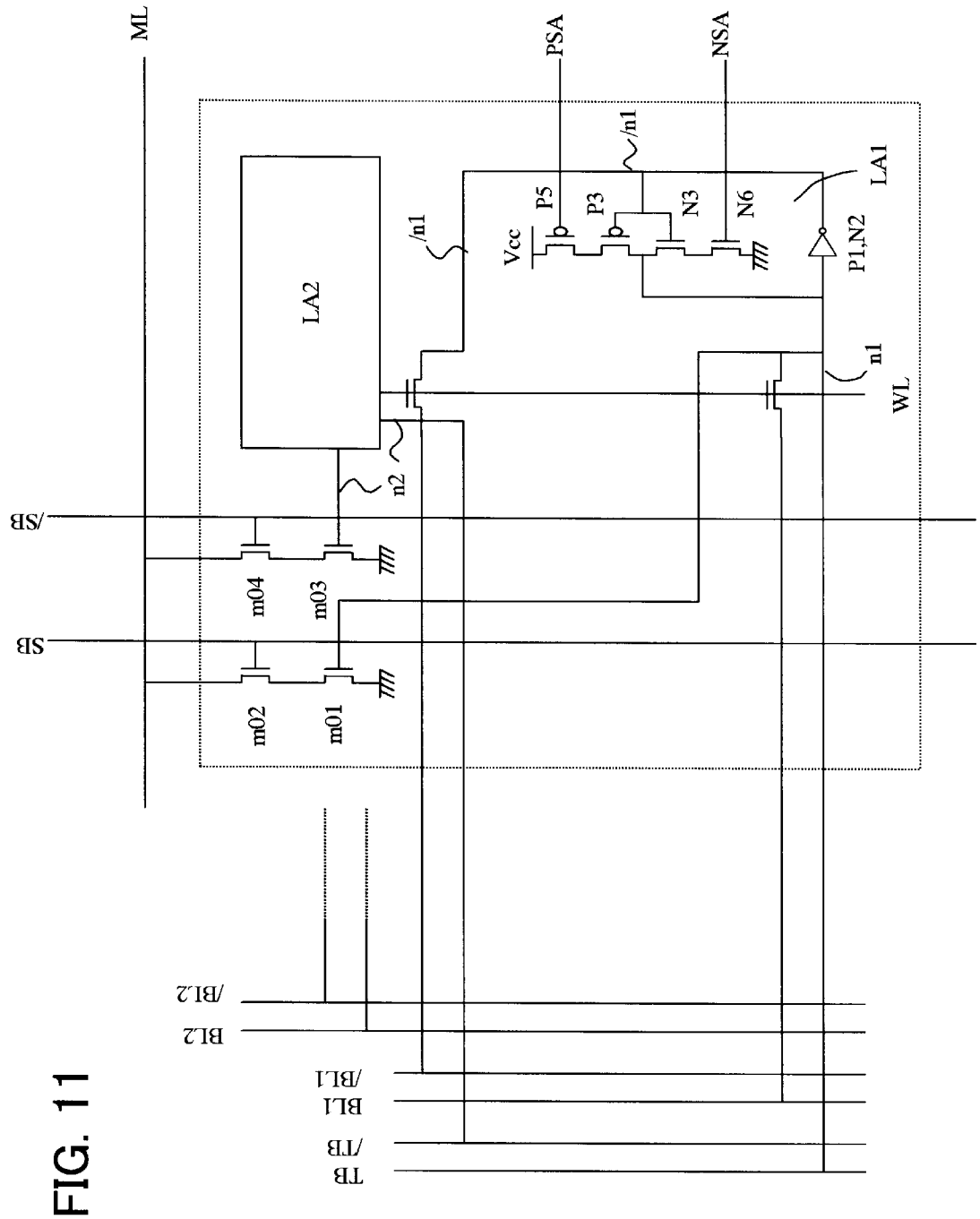
FIG. 11 is a CAM circuit diagram in the second embodiment.

FIGS. 10 and 11 are CAM circuit diagrams in the second embodiment. In the second embodiment, as shown in FIG. 10, the transfer cells TC*n* and TC*n*+1 in the transfer units TU*n*, TU*n*+1 consist of a latch circuit that cross connects a pair of inverters. Each inverter is an ordinary CMOS inverter and consists of a P channel transistor connected to the power source Vcc and an N channel transistor connected to the ground. Note here that these transfer cell inverters are as small as possible to allow reverse driving by the latch circuits within each memory cell.

In addition, as shown in FIG. 11, there is no short circuit within the memory cell MC as in the above first embodiment. Transistors P5 and N6 are provided as an activation circuit in only one of the inverters (transistors P3, N4) in latch circuit LA1 and there is no activation circuit in the other inverter (transistors P1, N2). Latch circuit LA2 has the same configuration. Because a transfer cell is a latch circuit comprising inverters that are smaller than those in memory cells, it is difficult for the latch circuit in the transfer cell to reversely drive the memory cell latch circuit. Alternatively, such reverse driving requires a great deal of time. Therefore, in this embodiment, transistors P5 and N6 are provided as an activation circuit in one inverter in the memory cell latch circuit LA1. When data is transferred, the activation circuit is deactivated, the inverter output is placed on high impedance, and the latch operation of the latch circuit LA1 is temporarily released.

The data transfer operation in this second embodiment is explained using the timing chart in FIG. 9 for reference. During period t1, the first transfer gate signals TG1*n*, and TG1*n*+1 are driven and the first transfer gate tg1 becomes conductive. This causes the latch circuits in memory cells MC1 and MC2 to drive the latch circuits in transfer cells TC*n* and TC*n*+1 and to transfer data. Here, the latch circuit in a memory cell can reversely drive the latch circuit in a transfer cell. The first transfer gate is then no longer conductive and the latch circuit in the transfer cell holds the data.

During period t2, activated signals PSA and NSA are placed on the H and L levels respectively and the latch circuits within the memory cells become inactivate. In this state, with the example in FIG. 11, node n1 moves to a high impedance state.

During the next period t3, the second transfer gate signals TG2*n* and TG2*n*+1 are driven and the second transfer gate tg2 is made conductive. This enables the transfer cell TC*n* and TC*n*+1 inverters to drive one of nodes n1 and n2 in each of the latch circuits LA1 and LA2 in the subsequent memory cell. These nodes n1 and n2 are in a state of high impedance and so can be driven to the H or L level by the transfer cell inverter. Accompanying this drive, the active inverter (transistors P1, N2) within the memory cell latch circuit drives the other nodes /n1 and /n2 and places them on the L or H level.

In the final period t4, by returning the activated signals PSA and NSA to the activated L and H levels, data is latched in the latch circuits LA1 and LA2 in the memory cells.

To shift memory cell data below a chosen address to an address of lower priority, as in the first embodiment, in periods t3 and t4, transfer gate signals should be controlled so that the first transfer gate tg1 is made conductive relative to a memory cell of higher priority than the chosen address and the second transfer gate tg2 is made conductive relative to a memory cell of lower priority.

In the second embodiment, a latch circuit comprising a pair of inverters is provided in the transfer cell and so there is no need to provide a short circuit in the latch circuit within a memory cell. This means that transisters P5 and N6 for activation merely need to be added to the memory cell configuration. Note however, that the size of the transfer cell will increase because a pair of inverters is required.

As explained above, in this embodiment, transfer cells that temporarily hold data are provided, via transfer gates, between memory cells adjacent to one another in a column. When entry data is to be transferred to a position of different priority, one transfer gate is opened to allow transfer of memory cell data into a transfer cell. The other transfer gate is then opened to allow transfer of the data into a memory cell.

In the above embodiment, when entry data is to be transferred to a memory cell of lower priority (higher address), as explained above, the first transfer gate tg1 is first opened and then the second transfer gate tg2 is opened. On the other hand, when entry data is to be transferred to a memory cell of higher priority (lower address), the second transfer gate tg2 is first opened and then the first transfer gate tg1 is opened.

Furthermore, when entry data from a memory cell with a priority lower (higher address) than that of a chosen address is to be transferred to a memory cell of lower priority (higher address), the first transfer gate tg1 is first opened, then the first transfer tg1 is opened again for an address with a priority higher than the chosen address (lower address) and the second transfer gate tg2 is opened for an address with lower priority.

Also, when entry data from a memory cell with higher priority (lower address) than a chosen address is to be transferred to a memory cell with higher priority (lower address), the second transfer gate tg2 is first opened, then the second transfer tg2 is opened again for an address with a lower priority than the chosen address and the first transfer gate tg1 is opened for an address of higher priority.

In the above embodiment, a memory cell has two latch circuits. However, when, as with DRAM, it is configured with one capacity and one transfer transistor, it is preferable that the transfer cell is configured with a latch circuit that cross connects a pair of inverters. This latch circuit has the same configuration as a sense amp circuit in DRAM and amplifies and latches memory cell data. It can then write data into the capacitor of the destination memory cell.

Thus, appropriate control by the TG decoder driver of the transfer gate signals enables all entry data within a memory cell to be transferred to another memory cell. Accordingly, there is no need to repeat read and write operations when transferring data as there was in conventional examples.

The present invention enables the bulk transfer of entry data stored in memory cells to adjacent memory cells along a column and enables improvement in the performance of systems with memory. is

What is claimed is:

1. A contents addressable memory that compares stored data and input data, and outputs address information in which matching data is stored, comprising:

memory cells arranged in a matrix at positions where word lines extending along a row cross bit lines extending along a column;

search buses extending along the column and match lines extending along the row;

a comparison circuit provided in each memory cell and which compares data in said search bus and data stored in memory cell and outputs comparison result to the match line; and transfer units each provided between a pair of said memory cells arranged along the column and each comprising a first transfer gate, a transfer cell for temporarily storing data from said memory cell, and a second transfer gate;

wherein data from one of said pair of memory cells is stored in said transfer cell via said first or second transfer gate, then the data thus stored in the transfer cell is stored in other of said pair of memory cells via said second or first transfer gate.

2. The contents addressable memory according to claim 1, wherein said transfer unit is provided between adjacent memory cells arranged along said column and wherein data from a plurality of memory cells arranged along the row is transferred collectively to memory cells that are adjacent along the column.

3. The contents addressable memory according to claim 1, wherein said transfer cells each has a capacitor for storing data, said memory cells each has a latch circuit that cross connects a pair of inverters, and furthermore, wherein when data from said transfer cell is to be transferred, latch circuit in said memory cell is temporarily placed in a neutral state, and thereafter, the transfer cell is connected to the memory cell, and data to be transferred is latched.

4. The contents addressable memory according to claim 3, wherein said memory cell latch circuit contains a short circuit that short-circuits a pair of nodes in the latch circuit and an activation circuit that controls activation of latch operation in the latch circuit, and wherein when data is to be transferred from said transfer cell to memory cell, said activation circuit temporarily deactivates the latch operation of said latch circuit and said short circuit short-circuits said pair of nodes.

5. The contents addressable memory according to claim 4, wherein when the memory cell is connected to said transfer cell and latches the transfer data, said activation circuit activates the operation of said latch circuit.

6. The contents addressable memory according to claim 1, wherein said transfer cell contains a first latch circuit in which a pair of inverters is cross connected, wherein said memory cell contains a second latch circuit in which a pair of inverters is cross connected, and furthermore, wherein when data from said transfer cell is to be transferred, the second latch circuit in said memory cell is temporarily placed in a neutral state, and thereafter, the transfer cell is connected to the memory cells, and data to be transferred is latched by the second latch circuits.

7. The contents addressable memory according to claim 6, wherein the pair of inverters that makes up the first latch circuit in said transfer cell is smaller than the pair of inverters in the second latch circuit in said memory cell.

8. The contents addressable memory according to claim 6, wherein an activation circuit that activates and deactivates inverter operations is provided for one inverter in the second latch circuit of said memory cell, and wherein when data is to be transferred from said transfer cell to memory cell, said activation circuit temporarily releases the latch operation of said second latch circuit.

* * * * *